(12) United States Patent
Kuo

(10) Patent No.: US 6,465,276 B2
(45) Date of Patent: Oct. 15, 2002

(54) POWER SEMICONDUCTOR PACKAGE AND METHOD FOR MAKING THE SAME

(75) Inventor: Frank Kuo, Kaohsiung (TW)

(73) Assignee: Siliconx (Taiwan) Ltd., Kaohsiung (TW)

(*) Notice: Subject to any disclaimer, the term of this patent is extended or adjusted under 35 U.S.C. 154(b) by 0 days.

(21) Appl. No.: 09/879,367

(22) Filed: Jun. 12, 2001

(65) Prior Publication Data

US 2001/0044167 A1 Nov. 22, 2001

(30) Foreign Application Priority Data

May 18, 2000 (TW) ........................................ 089109555

(51) Int. Cl.[7] .............................................. H01L 21/44
(52) U.S. Cl. ........................ 438/110; 438/111; 438/112; 438/121; 438/123; 257/728
(58) Field of Search ................................ 438/110, 111, 438/112, 121, 123; 257/728

(56) References Cited

U.S. PATENT DOCUMENTS

| | | | | |
|---|---|---|---|---|
| 5,105,536 A | * | 4/1992 | Neugebauer et al. | ......... 29/832 |
| 5,637,922 A | * | 6/1997 | Fillion et al. | ................ 257/691 |
| 6,040,626 A | * | 3/2000 | Cheah et al. | ................ 257/341 |
| 6,165,820 A | * | 12/2000 | Pace | ........................... 438/106 |
| 6,307,755 B1 | * | 10/2001 | Williams et al. | ............ 174/260 |
| 6,319,755 B1 | * | 11/2001 | Mauri | ........................ 438/106 |

* cited by examiner

*Primary Examiner*—Carl Whitehead, Jr.
*Assistant Examiner*—Jeff Vockrodt
(74) *Attorney, Agent, or Firm*—Knobbe, Martens, Olson & Bear, LLP.

(57) ABSTRACT

A power semiconductor die has a drain contact, a source contact, and a gate contact. A lead frame has first, second, and third terminals. A metal sheet has first and second contacting portions and a bridging portion interconnecting the first and second contacting portions. The power semiconductor die is mounted on the lead frame such that the drain contact is connected to the first terminal. The metal sheet is attached to the top surface of the power semiconductor die and the second and third terminals of the lead frame such that the source contact and the second terminal are connected to the first contacting portion, and such that the gate contact and the third terminal are connected to the second contacting portion. The bridging portion is subsequently cut for disconnecting electrically the first and second contacting portions.

3 Claims, 5 Drawing Sheets

POWER SEMICONDUCTOR PACKAGE AND METHOD FOR MAKING THE SAME

BACKGROUND OF THE INVENTION

1. Field of the Invention

This invention relates to a power semiconductor package and a method for making the same, more particularly to a power semiconductor package with a power MOSFET die and a method for making the same.

2. Description of the Related Art

FIG. 1 illustrates a conventional power semiconductor package. The power semiconductor package includes a semiconductor die 11, such as a power MOSFET die, which has a bottom surface defining a drain contact (not shown), and a top surface that includes a first metallized region defining a source contact 111 and a second metallized region defining a gate contact 112. The power semiconductor package further includes a bottom metal plate 121 coupled to and electrically connected to the drain contact, a plurality of drain terminals 122 extending outwardly from the bottom metal plate 121 to be electrically connected to the drain contact, a plurality of spaced apart source terminals 123 electrically connected to the source contact 111 via a plurality of gold wires 125, and a gate terminal 124 electrically connected to the gate contact 112 via a gold wire 126.

The aforesaid power semiconductor package is disadvantageous in that in order to reduce the electrical resistance from the source contact 111 to the source terminals 123, a large number of the gold wires 125 are required to be employed in the power semiconductor package. Since the gold wires 125 are very expensive and can only be stitch bonded to the source contact 111 and the source terminal 123 one at a time, such number of the gold wires 125 will increase the production cost and the manufacturing time considerably. In addition, the reduction of the electrical resistance is still poor, due to a relatively small increase in the cross-sectional area of the gold wires 125 when a large number of the gold wires 125 is employed. Moreover, the gold wires 125 may not be able to provide sufficient surface area for dissipating a large amount of heat generated by the semiconductor die 11, particularly by a high current power MOSFET die, during operation.

FIG. 2 illustrates another conventional power semiconductor package that employs a metal plate 23 to replace the gold wires 125 so as to reduce the aforesaid electrical resistance and to increase the surface area as required to dissipate the aforementioned heat, and to reduce the manufacturing time due to elimination of the wire bonding operation for the gold wires 125. However, the power semiconductor package of this type is disadvantageous in that two bonding apparatuses are needed for stitch bonding the gold wire 126 to the gate contact 112 and the gate terminal 124 and for bonding the metal plate 23 to the source contact 111 and the source terminals 123 in the production of the power semiconductor package. Moreover, the size of the metal plate 23 employed in the power semiconductor package is preferably as large as possible to cover the source contact 111 without extending to the gate contact 112. However, the metal plate 23 is normally coupled to the source contact 111 via a conductive material, such as a conductive epoxy or a conductive paste, which can overflow and interfere with the surface of the gate contact 112 upon curing or reflowing of the conductive material. As a consequence, the gate contact 112 may be contaminated with the conductive material, and the gold wire 26 may be poorly stitch bonded to the gate contact 112 because of the aforesaid contamination.

SUMMARY OF THE INVENTION

Therefore, the object of the present invention is to provide a method for bonding a power semiconductor die to a lead frame via a metal sheet that is capable of overcoming the aforementioned problems.

Another object of the present invention is to provide a power semiconductor package that includes a power MOSFET die, a metal sheet coupled to a source contact on the power MOSFET die, and a terminal having a V-shaped end portion which is able to facilitate connection of the terminal to the metal sheet.

According to one aspect of the present invention, a method for bonding a power semiconductor die to a lead frame comprises the steps of: providing a power semiconductor die that has a bottom surface defining a drain contact, and a top surface which includes a first metallized region defining a source contact, and a second metallized region defining a gate contact; providing a lead frame that has first, second, and third terminals; providing a metal sheet that has first and second contacting portions and a bridging portion interconnecting the first and second contacting portions; mounting the power semiconductor die on the lead frame such that the drain contact is coupled to and is electrically connected to the first terminal; attaching the metal sheet to the top surface of the power semiconductor die and the second and third terminals of the lead frame such that the source contact and the second terminal are coupled to and are electrically connected to the first contacting portion, and such that the gate contact and the third terminal are coupled to and are electrically connected to the second contacting portion; and cutting the bridging portion for disconnecting electrically the first and second contacting portions.

According to another aspect of the present invention, a power semiconductor package comprises: a power MOSFET die that has a bottom surface defining a drain contact, and a top surface which includes a first metallized region defining a source contact, and a second metallized region defining a gate contact; a first metal sheet that is coupled to and that is electrically connected to the source contact, and that has one end extending outwardly from the power MOSFET die; a second metal sheet that is coupled to and that is electrically connected to the gate contact; a first terminal disposed adjacent to the power MOSFET die and coupled to and electrically connected to the drain contact; a second terminal disposed adjacent to the power MOSFET die and having a substantially V-shaped end portion that confines a substantially V-shaped groove to receive said one end of the first metal sheet, the V-shaped end portion of the second terminal being coupled to and being electrically connected to said one end of the first metal sheet; and a third terminal disposed adjacent to the power MOSFET die and coupled to and electrically connected to the second metal sheet.

BRIEF DESCRIPTION OF THE DRAWINGS

In drawings which illustrate an embodiment of the invention.

DETAILED DESCRIPTION OF THE PREFERRED EMBODIMENT

Figure 1:
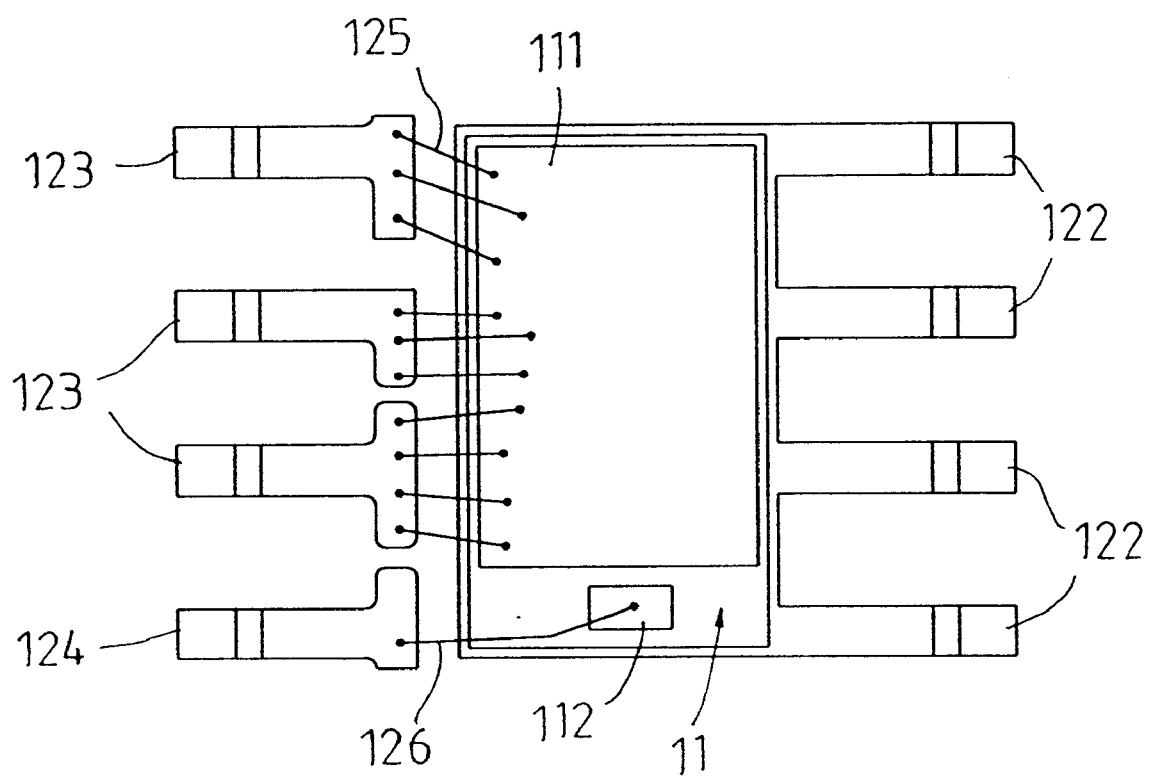
FIG. 1 is a schematic top view of a conventional power semiconductor package.
Figure 2:
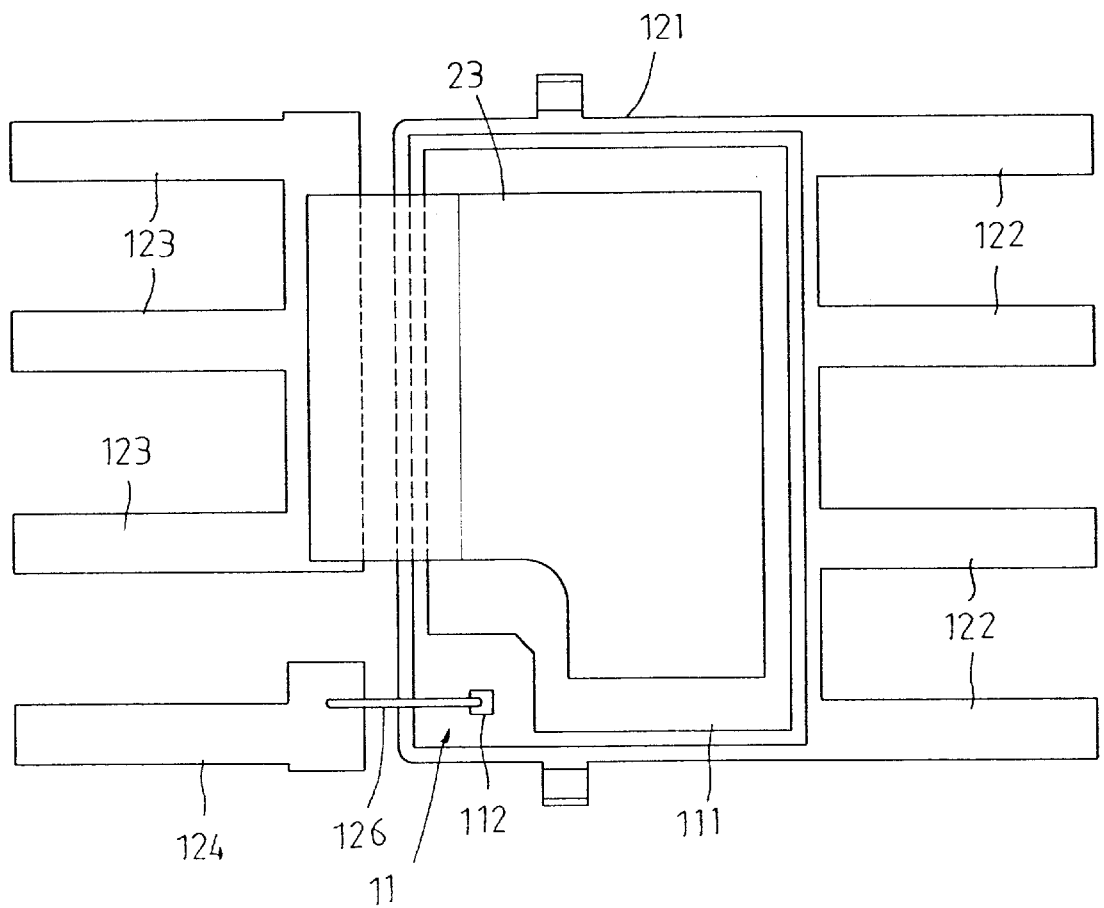
FIG. 2 is schematic top view of another conventional power semiconductor package.
Figure 3:
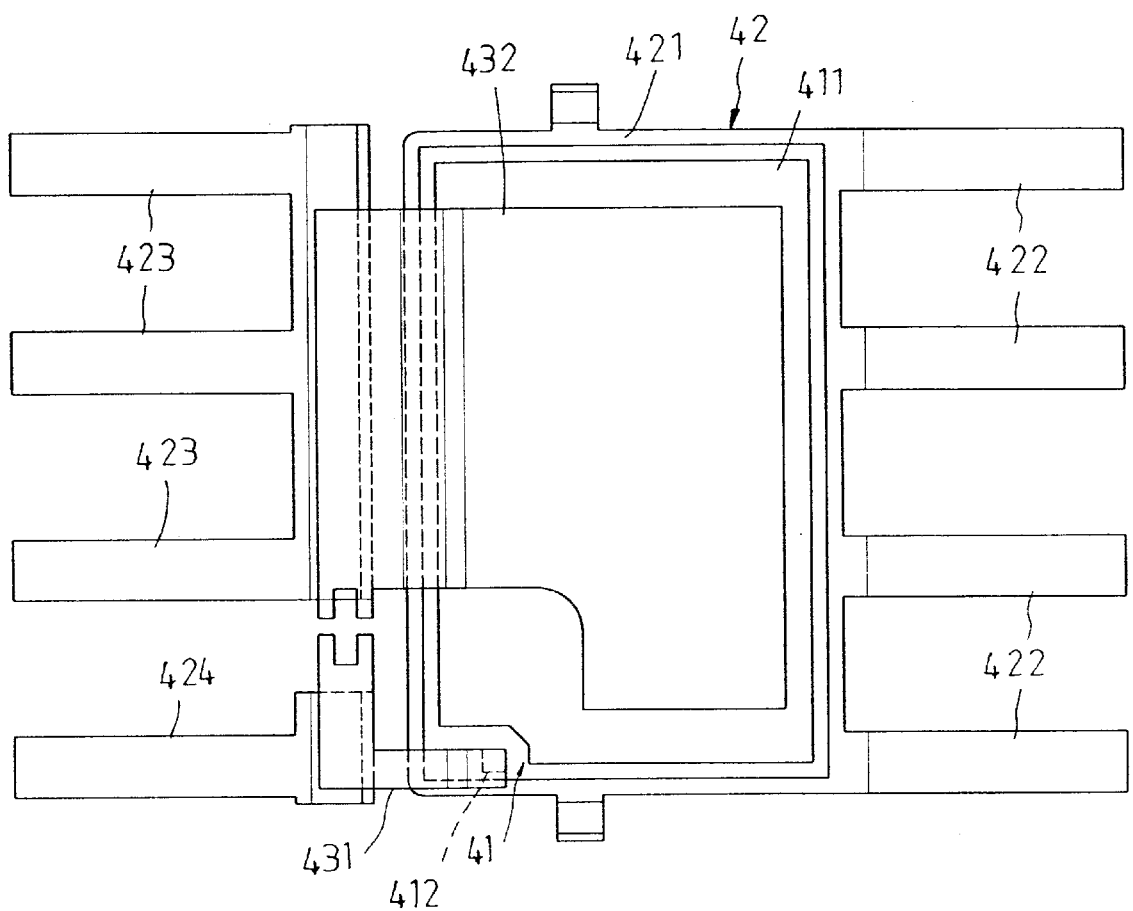
FIG. 3 is a schematic top view of a power semiconductor package embodying this invention.
Figure 5:
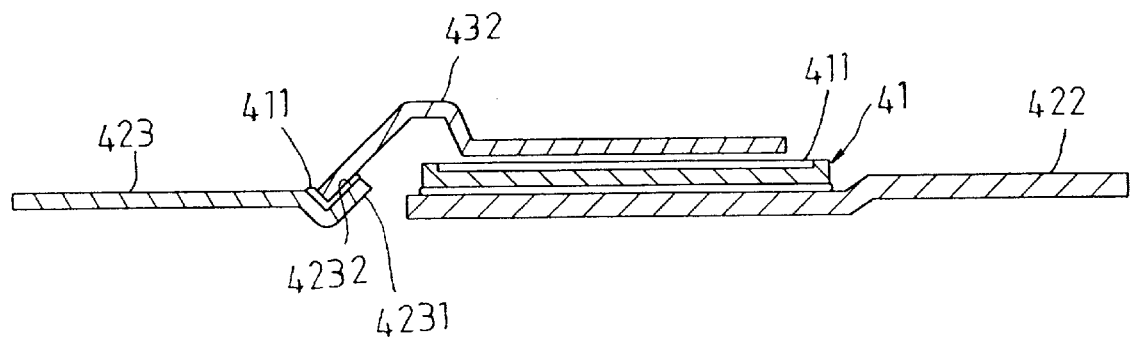
FIG. 5 is a schematic cross-sectional side view of the power semiconductor package of FIG. 4 taken along line V—V to illustrate connection of a source terminal and a first contacting portion of the metal sheet.
Figure 6:
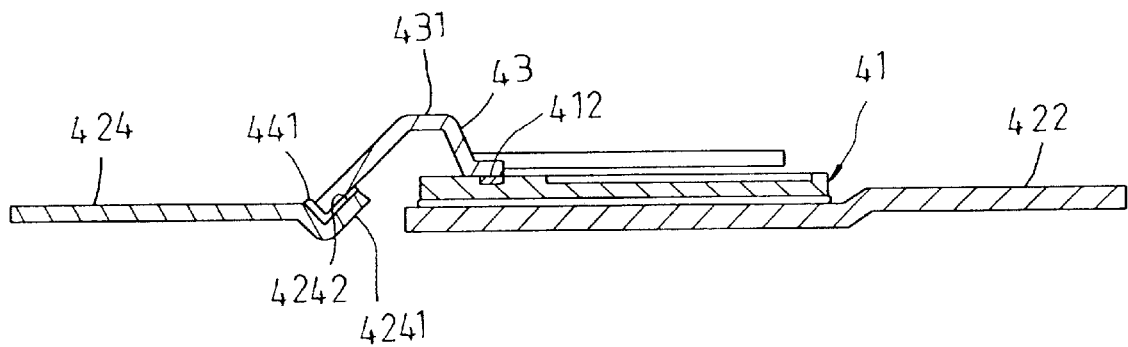
FIG. 6 is a schematic side view of the power semiconductor package of FIG. 4 taken along line VI—VI to illustrate connection of a gate terminal and a second contacting portion of the metal sheet.

FIGS. 3, 5 and 6 illustrate a power semiconductor package embodying this invention. The power semiconductor package includes a power MOSFET die 41, a first metal sheet 432, a second metal sheet 431, a plurality of aligned first terminals 422, a plurality of aligned second terminals 423, and a third terminal 424. The power MOSFET die 41 has a bottom surface defining a drain contact (not shown), and a top surface which includes a first metallized region defining a source contact 411, and a second metallized region defining a gate contact 412. The first metal sheet 432 is coupled to and is electrically connected to the source contact 411 via a conductive material (not shown), such as a conductive paste or a conductive epoxy, and has one end extending outwardly from the power MOSFET die 41. The second metal sheet 431 is coupled to and is electrically connected to the gate contact 412 via the conductive material (not shown), and has one end extending outwardly from the power MOSFET die 41. The first terminals 422 are disposed adjacent to the power MOSFET die 41, and are coupled to and are electrically connected to the drain contact via another conductive material (not shown), such as a conductive epoxy or a conductive paste that contains silver. The second terminals 423 are disposed adjacent to the power MOSFET die 41, and respectively have substantially V-shaped end portions 4231 that respectively confine substantially V-shaped grooves 4232 to receive said one end of the first metal sheet 432, and that are coupled to and are electrically connected to said one end of the first metal sheet 432 via the conductive material 441. The third terminal 424 is disposed adjacent to the power MOSFET die 41, and has a substantially V-shaped end portion 4241 that confines a substantially V-shaped groove 4242 to receive said one end of the second metal sheet 431, and that is coupled to and electrically connected to said one end of the second metal sheet 431 via the conductive material 441.

Figure 4:
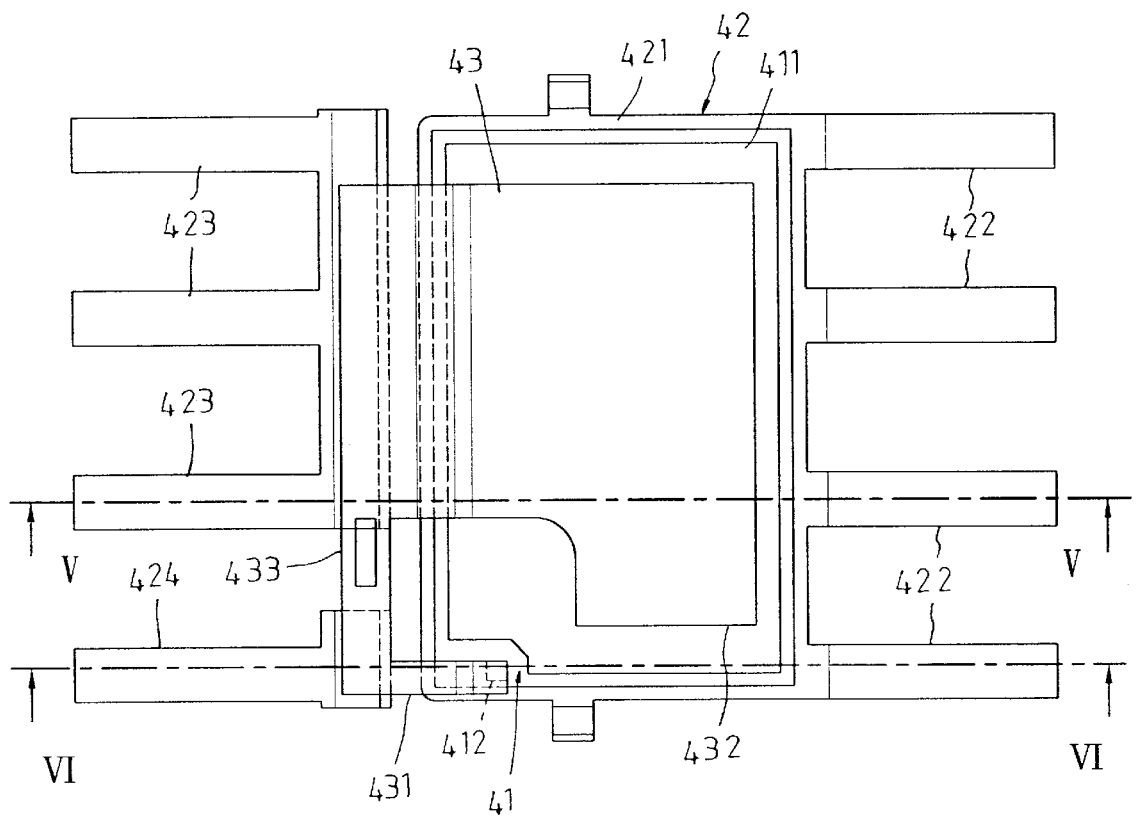
FIG. 4 is a schematic top view to illustrate a metal sheet in an uncut state before forming the power semiconductor package of FIG. 3.

Referring now to FIG. 4, in combination with FIGS. 3, 5 and 6, the power semiconductor package of this invention is made by a method that comprises the steps of: providing the aforesaid power MOSFET die 41, providing a lead frame 42 that includes the aforesaid first, second, and third terminals 422, 423, 424, providing a metal sheet 43 that includes first and second contacting portions which define respectively the aforesaid first and second metal sheets 432, 431, and a bridging portion 433 which interconnects the first and second contacting portions, mounting the power MOSFET die 41 on the lead frame 42 such that the drain contact is coupled to and is electrically connected to the first terminal 422 via a conductive material (not shown), attaching the metal sheet 43 to the top surface of the power MOSFET die 41 and the second and third terminals 423, 424 of the lead frame 42 such that the source contact 411 and the V-shaped end portions 4231 of the second terminals 423 are coupled to and are electrically connected to the first contacting portion of the metal sheet 43 via the conductive material 411, and such that the gate contact 412 and the V-shaped end portion 4241 of the third terminal 424 are coupled to and are electrically connected to the second contacting portion of the metal sheet 43 via the conductive material 411, and cutting the bridging portion 433 for disconnecting electrically the first and second contacting portions of the metal sheet 43 via a cutter (not shown), such as a laser cutter.

With the metal sheet 43 as a bonding medium, the connections of the source contact 411 to the second terminals 423 and the gate contact 411 to the third terminal 424 in the production of the power semiconductor package of this invention can be accomplished simultaneously via a bonding apparatus, thereby eliminating the use of two bonding apparatuses and the contamination problem associated with the prior art. Moreover, the designs of the V-shaped end portions 4231 of the second terminals 423 and the V-shaped end portions 4241 of the third terminal 423 are able to facilitate and to improve qualitatively the bonding of the metal sheet 43 to the source and gate terminals 423, 424.

With the invention thus explained, it is apparent that various modifications and variations can be made without departing from the spirit of the present invention. It is therefore intended that the invention be limited only as recited in the appended claims.

I claim:

1. A method for bonding a power semiconductor die to a lead frame, comprising the steps of:

providing a power semiconductor die that has a bottom surface defining a drain contact, and a top surface which includes a first metallized region defining a source contact, and a second metallized region defining a gate contact;

providing a lead frame that has first, second, and third terminals;

providing a metal sheet that has first and second contacting portions and a bridging portion interconnecting the first and second contacting portions;

mounting the power semiconductor die on the lead frame such that the drain contact is coupled to and is electrically connected to the first terminal;

attaching the metal sheet to the top surface of the power semiconductor die and the second and third terminals of the lead frame such that the source contact and the second terminal are coupled to and are electrically connected to the first contacting portion, and such that the gate contact and the third terminal are coupled to and are electrically connected to the second contacting portion; and cutting the bridging portion for disconnecting electrically the first and second contacting portions.

2. The method of claim 1, wherein the first and second contacting portions and the bridging portion of the metal sheet are integrally formed.

3. The method of claim 1, wherein the power semiconductor die is a MOSFET die.

* * * * *